US008728252B2

(12) United States Patent
Avelar Batista Wilson et al.

(10) Patent No.: US 8,728,252 B2
(45) Date of Patent: May 20, 2014

(54) TREATMENT OF METAL COMPONENTS

(75) Inventors: Junia Cristina Avelar Batista Wilson, Kettering (GB); Elliott Ashley Fielding Spain, Cambridge (GB); Jonathan Housden, Royston (GB); Allan Matthews, Sheffield (GB); Adrian Leyland, Sheffield (GB)

(73) Assignees: Tecvac Limited, Swavesey (GB); The University of Sheffield, Sheffield (GB)

( * ) Notice: Subject to any disclaimer, the term of this patent is extended or adjusted under 35 U.S.C. 154(b) by 1403 days.

(21) Appl. No.: 12/076,836

(22) Filed: Mar. 24, 2008

(65) Prior Publication Data

US 2009/0236014 A1 Sep. 24, 2009

(30) Foreign Application Priority Data

Mar. 20, 2008 (GB) .................................. 0805261.5

(51) Int. Cl.
*C23C 8/10* (2006.01)
*C23C 14/00* (2006.01)
*C23C 14/32* (2006.01)
*C23C 16/00* (2006.01)

(52) U.S. Cl.
USPC ........... 148/287; 148/286; 148/285; 148/284; 204/192.16; 204/192.12; 204/192.1; 427/248.1

(58) Field of Classification Search
None
See application file for complete search history.

(56) References Cited

U.S. PATENT DOCUMENTS

| | | | | |
|---|---|---|---|---|
| 3,673,071 | A | 6/1972 | Pritchard et al. | 204/192.24 |
| 5,037,438 | A * | 8/1991 | Davidson | 623/22.15 |
| 5,221,416 | A | 6/1993 | Kishi et al. | 156/627 |
| 5,370,694 | A | 12/1994 | Davidson | 623/16 |
| 5,372,600 | A | 12/1994 | Beyar et al. | 606/108 |
| 5,415,704 | A | 5/1995 | Davidson | 148/316 |
| 5,498,302 | A | 3/1996 | Davidson | 148/317 |
| 6,210,807 | B1 | 4/2001 | Dong et al. | 428/472 |
| 6,833,197 | B1 | 12/2004 | Dong et al. | 428/472.1 |

FOREIGN PATENT DOCUMENTS

| | | | |
|---|---|---|---|
| AU | 2295970 A | 6/1972 | |
| GB | 2 261 226 A | 5/1993 | C23C 14/32 |
| GB | 2261226 * | 5/1993 | C23C 14/32 |
| JP | 03010061 | 1/1991 | C23C 8/36 |

OTHER PUBLICATIONS

Totten et al (Handbook of Metallurgical Process Design (2004).*

* cited by examiner

*Primary Examiner* — Yoshitoshi Takeuchi
(74) *Attorney, Agent, or Firm* — DASCENZO Intellectual Property Law, P.C.

(57) ABSTRACT

A process for treating a non-ferrous metal component, comprising placing the component into a process chamber at an elevated temperature, biasing the component to have a potential capable of attracting ions, introducing oxygen into the chamber at a pressure such that a glow discharge comprising oxygen ions is generated, the process chamber additionally comprising a glow discharge ionization enhancing means, and activating the glow discharge ionization enhancing means thereby increasing charged species density of the glow discharge, the oxygen ions flowing towards the component and colliding the surface thereof at least some of which diffuse into the component.

12 Claims, 4 Drawing Sheets

TREATMENT OF METAL COMPONENTS

TECHNICAL FIELD

The invention relates to a process of treating the surface of non-ferrous metal components with oxygen, and the components obtainable by such a process.

BACKGROUND OF THE INVENTION

Methods of treating of the surface of metal components have been known for a very long time. The aim of such treatments is usually to improve one or more physical properties of the surface of such components e.g. improving hardness, improving corrosion resistance, reducing wear rate, etc.

One way of treating such metal components is to bombard the surface with non-metal ions which alter the surface composition, usually resulting in improved physical properties.

In particular, treating non-ferrous metals e.g. aluminium, titanium, magnesium, zirconium and their alloys with oxygen can give significant improvements in hardness, wear resistance and corrosion resistance due to thickening and strengthening of the naturally occurring surface oxide layer. Numerous methods of producing such regions of oxide have been proposed.

U.S. Pat. No. 6,210,807 discloses a gaseous oxidation method to improve the tribological properties of pure grades of titanium and titanium alloys. Gaseous oxidation is performed at a temperature range of 500 to 725° C. for 0.5 to 100 hours, producing an adherent surface compound layer of 0.2-2 μm on a solid solution-strengthened diffusion zone having a depth of 5 to 50 μm.

Another gaseous oxidation process is described in U.S. Pat. No. 6,833,197, a process referred to as 'oxygen boost diffusion', to harden titanium, zirconium and their alloys to depths of 200 to 500 μm. Components are first heat-treated in an oxidizing atmosphere at a temperature range of 700 to 1000° C. and subsequently heat-treated in a vacuum or in a neutral or inert atmosphere at a temperature range of 700 to 1000° C. to promote oxygen diffusion from the oxide layer into the component to produce a sigmoid-shaped hardness profile.

U.S. Pat. No. 5,037,438 discloses orthopedic implants of zirconium or zirconium-based alloy coated with thin blue-black or black zirconium oxide. Zirconium oxide is formed by air oxidation in a furnace or by salt bath oxidation. U.S. Pat. No. 5,370,694 is also directed to the formation of blue-black zirconium oxide, black zirconium oxide and zirconium nitride coatings on zirconium or zirconium alloy prostheses. Zirconium oxide coatings are produced by either air or salt bath oxidation at 550-800° C.

U.S. Pat. No. 5,372,660 discloses a method of surface hardening of titanium alloys with an amount of zirconium sufficient to allow the formation of zirconium oxide at the implant surface. The oxidation process is carried out in an oxygen atmosphere at 200-1200° C.

U.S. Pat. No. 5,415,704 and U.S. Pat. No. 5,498,302 describe methods of hardening implants by diffusing oxygen, nitrogen or carbon into titanium, zirconium and cobalt-based alloys with small concentrations of a metal solute via internal oxidation or nitridation.

Other methods of oxidation currently applied to aluminium, titanium, magnesium and their alloys involve aqueous environments, such as plasma electrolytic oxidation and anodizing.

D.C. diode glow discharges have been used to harden pure titanium and Ti-6Al-4V with oxygen, using air as the treatment atmosphere. Ti-6Al-4V has also been treated using a mixture of argon and oxygen under a D.C. diode glow discharge.

SUMMARY OF THE INVENTION

The invention relates to a process for treating a non-ferrous metal component, comprising placing the component into a process chamber at an elevated temperature, biasing the component to have a potential capable of attracting ions, introducing oxygen into the chamber at a pressure such that a glow discharge comprising oxygen ions is generated, the process chamber additionally comprising a glow discharge ionization enhancing means, and activating the ionization enhancing means thereby increasing the charged species density of the glow discharge, the oxygen ions flowing towards the component and colliding with the surface thereof, at least some of which diffuse into the component.

The invention involves the use of enhanced glow discharges, to carry out oxidation treatment processes on non-ferrous components, such as titanium, aluminium, magnesium, zirconium and their alloys. The enhanced charged species densities in the glow discharge increases the number of the oxygen ions bombarding and penetrating the surface of the component forming oxides therein, and result in surfaces which are hardened, have increased resistance to corrosion, have improved wear resistance and which are relatively smooth without requiring extended processing times.

The treated components are suitable for numerous applications e.g. in aerospace, biomedical and tooling industries.

The glow discharge can be generated by any suitable technique available to the skilled person, e.g. D.C., A.C. or R.F. Applying D.C. by connecting the inside of the processing chamber to earth, thus forming a glow discharge with the negatively biased component, is preferred.

The glow discharge ionization enhancing means, for example, can be a positively biased electrode inside the chamber, a plasma source having a filament or a hollow cathode, a microwave discharge or a thermionic emission means. Preferably it is a thermionic emission means.

The thermionic emission means may be a negatively biased filament made from any material which can act as a source of energetic electron emission at the high temperatures involved in the process. Examples of suitable materials are tungsten and rhenium. However, for reasons of cost, tungsten is the preferred material.

It has been found that the material forming the thermionic emission means can oxidize and eventually fail, possibly before the treatment process has finished. This has been found to be particularly the case when tungsten is used.

Extended lifetimes of filaments being the thermionic emission means have, however, been found to be achievable by employing one or more of a number of methods developed in this invention. For example it is preferable that the diameter of the filament is greater than 1.0 mm. As the electrical resistance of the filament significantly decreases as its diameter increases, the use of thicker filaments requires more power to heat them and obtain sufficient electron emission to sustain the discharge. Therefore, high current power supplies are required to heat the filament at these thicknesses.

The lifetime of such filaments has also been found to be significantly improved when inert gases are added to the oxygen environment, during treatment, such that the partial pressure of oxygen during treatment is less than 75% of the total pressure. Suitable inert gases include argon, krypton, helium, neon, preferably argon. Nitrogen may also be used in combination with these gases.

It has been found that better results are achieved when the overall vacuum pressure during oxidation is from 0.1 to 1.0 Pa, e.g. around 0.4 Pa. At these pressures, a greater number of ions will reach the surface of the component with energies near the plasma sheath voltage, enhancing the delivery of high energy ions to the surface of the component and enhancing the overall kinetics of the oxidation process.

The component potential (or bias voltage) may be any suitable value, e.g. from 100 to 2000 V, however, further reductions in the surface roughness of the treated components can be achieved by operating the process at a component potential of from 100 to 500 V e.g. 200 V. It is also preferable to operate at relatively low temperatures e.g. from 300° C. to 800° C., preferably from 400° C. to 700° C., minimizing component distortion and microstructural changes.

Typically the objective is to arrange the process parameters such that the oxygen ions collide with and penetrate into the surface of the component. The hardened layer, or hardened case, which results from carrying out the invention comprises an inner oxygen diffusion layer and an outer (surface) oxide layer.

The process may be carried out for as long as is desired (e.g. 0.1 to 100 hours) and the duration is usually governed by the thickness of the hardened case desired. However, the process can be carried out for relatively short periods of time, e.g. from 0.3 to 20 hours, preferably about 4 hours and still provide excellent physical properties at the surface.

Typically thickness of a hardened case may vary from 5 to 300 micrometers, preferably from 20 to 80 micrometers thick, more preferably from 30 to 50 micrometers. The resulting thickness of the hardened case is largely dependent upon operating temperature and duration.

For instance, treating a Ti-6Al-4V alloy at 700° C. for 4 hours produces a hardened case comprising a 0.7-0.8 micron surface oxide layer, which is mainly of the $TiO_2$ rutile phase, above an oxygen diffusion layer having a depth of about 50 microns.

In many applications, the presence of an oxide layer is undesirable. For example a lack of adhesion can result if the treated component is subsequently to be coated, especially with a PVD nitride, carbide or carbonitride coating. However, it has been found that the build-up of this oxide layer can be controlled or prevented by judicious selection of operating parameters.

For example it has been found that feeding the oxygen into the chamber by varying its flow rate, e.g. by intermittently slowing or stopping the flow, can greatly reduce the build-up of the oxide layer. Such variation, or 'pulsing' of the oxygen flow has also surprisingly been found to prolong the lifetime of the thermionic emission means, e.g. tungsten filament allowing filaments of less thickness to be used or to permit longer processing times.

For example, it has been found to be beneficial to have periods of oxygen flow into the chamber separated by periods where no oxygen flows into the chamber. The ratio of the time period when oxygen flows to when it does not flow is called the duty cycle ratio and may be from 0.05 to 0.95. It has been found that a less favourable hardening profile can result if the oxygen flow is stopped for too long. Therefore it is preferred to operate with a duty cycle of from 0.15 to 0.85, preferably from 0.25 to 0.75. Cycle times of pulsing can vary widely and cycle times of less than 60 minutes, e.g. from 20 to 60 minutes have been found acceptable. For example operating with a cycle time of 30 minutes and a duty cycle of 0.50 (i.e. oxygen flow on for 15 minutes then off for 15 minutes) gives good results.

As discussed above, the lifetime of the thermionic emission means, e.g. tungsten filament can be extended by having an oxygen partial pressure during the treatment process of less than 75%, the remainder being an inert gas. A low oxygen partial pressure has also been found to reduce the build-up of the oxide layer. In fact, it has been found that oxygen partial pressures may be reduced to below 50%, or even to below 40%, e.g. around 30%, to further reduce build-up of the oxide layer. A currently preferred gas mixture is 30% oxygen and 70% argon.

It has also been found that reducing the oxygen partial pressure still further, or even taking it to zero, at the end of the treatment process can remove any oxide layer which may have previously built up. This is achieved simply by stopping the oxygen flow so that the chamber contains mostly or only inert gas (e.g. argon, krypton, helium, neon or xenon, optionally mixed with nitrogen). This plasma heating step, or "soaking" stage, is believed to allow oxygen in the oxide layer to diffuse into the component whilst ion bombardment of inert gas aids in disruption of the oxide layer. In this stage of the process oxygen partial pressures may be from 0 to 10%, preferably zero, at a temperature of from 400° C. to 800° C. for a period of 0.3 to 2.0 hours.

Any or all of the above techniques can be employed in any combination in order to tailor the thickness, structure and composition of the surface oxide layer as desired, or possibly eliminate it entirely.

For example, treating a metal component with pulsed oxygen followed by a period of plasma heating in inert gas can eliminate the surface oxide layer entirely. For instance, it has been found that operating with pulsed oxygen for 165 minutes at a duty cycle ratio of 0.25 or 0.50 with cycle times of 20 or 30 minutes, followed by a plasma heat step in either argon or a mixture of argon and nitrogen for 75 minutes (to give a total process time of 4 hours), gave a treated component with no oxide layer.

As mentioned above, the treated surface of the component may be subsequently coated, e.g. by a physical vapour deposition (PVD) and/or a chemical vapour deposition (CVD) process. It has been found that the surfaces generated in the process of the invention are particularly well suited to such coatings, particularly where it has been carried out such that no surface oxide layer is present. PVD and/or CVD coatings may be deposited by any known process in the art, e.g. using D.C., A.C. or R.F.

It is possible that such a coating process can follow directly on from the oxidation process in the same process chamber and without exposing the component to the atmosphere in an integrated process. Alternatively the coating process can be carried out independently in a separate cycle, in a two-stage process.

It is preferred that the coatings applied are hard ceramic coatings such as a nitride, carbide or carbonitride. Typically such coatings have a thickness in the range of from 0.1 to 50 micrometers.

Combining the oxidation process of the invention with such hard ceramic coatings gives synergistic benefits and further increases the load-bearing capacity of the component's surface, minimizes elastic and plastic deformation between the coating and the component due to the hardened surface.

The invention will now be illustrated with reference to the following drawings, in which.

Figure 7:
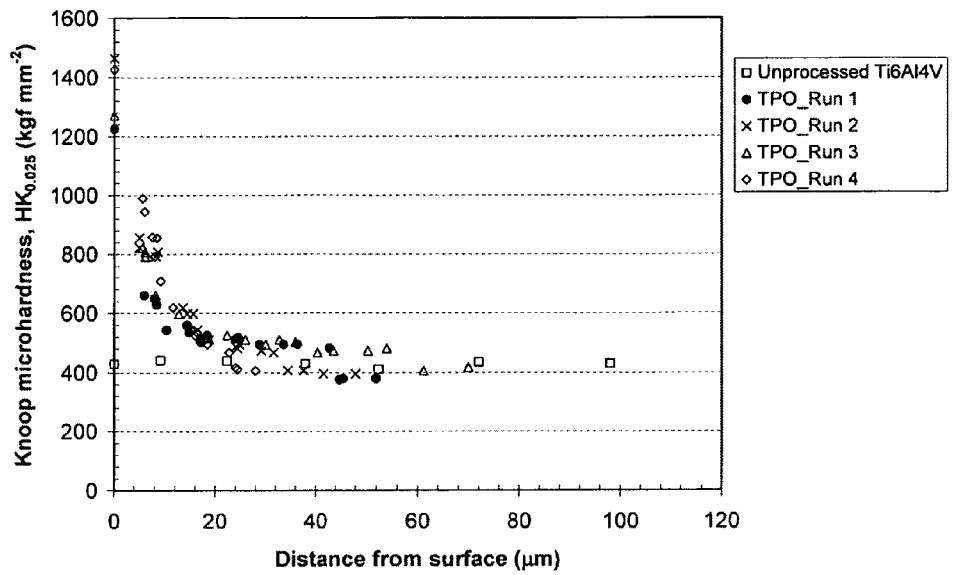
Figure 8:
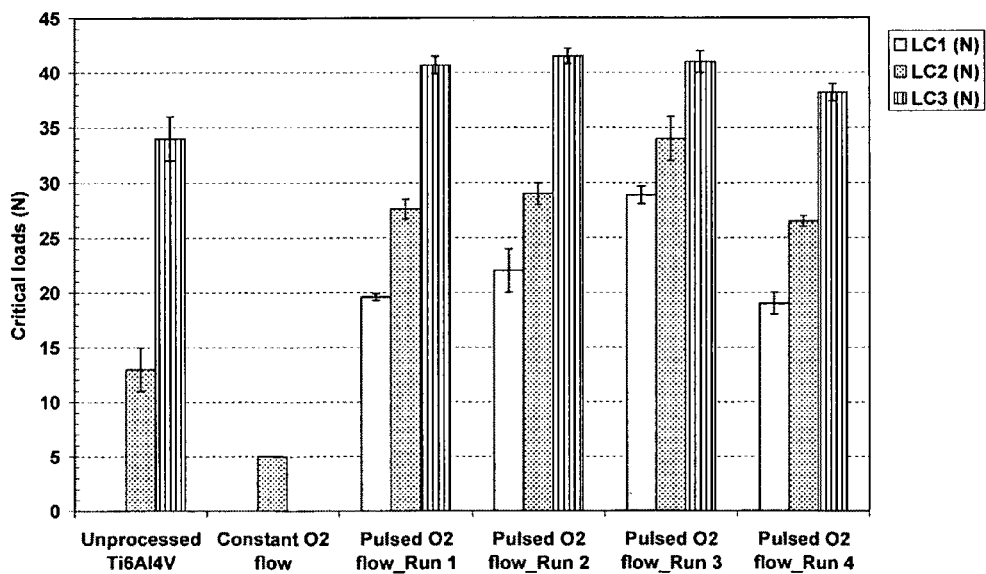

FIG. 7 is a chart showing Knoop microhardness-depth profiles obtained for Ti-6Al-4V in unprocessed condition and after TPO treatments FIG. 8 is a chart showing critical adhesion loads of PVD TiN coating on (a) unprocessed Ti-6Al-4V, (b) standard TPO-treated Ti-6Al-4V with constant oxygen flow, having a top $TiO_2$-rutile surface oxide layer and (c) pulsed TPO-treated Ti-6Al-4V samples, subjected to pulsed TPO followed by plasma heating in argon or in argon and nitrogen.

DETAILED DESCRIPTION OF THE INVENTION

Figure 1:
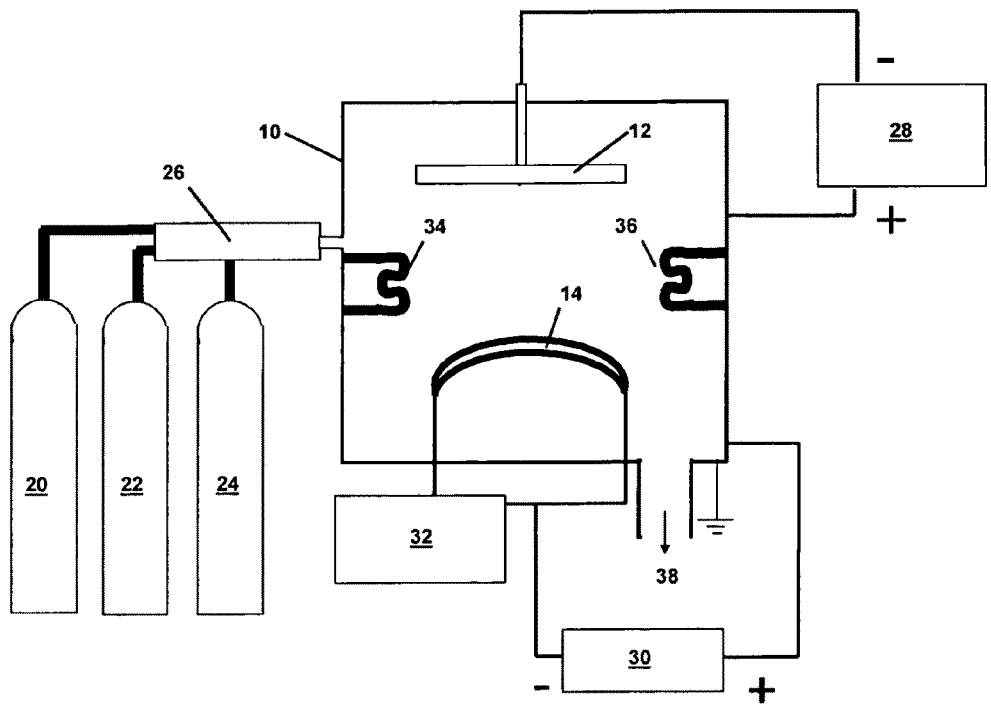
FIG. 1 illustrates a schematic of the apparatus used to carry out the triode plasma oxidation process (TPO) according to the invention.

FIG. 1 shows a stainless steel process chamber 10 of dimensions 1.0 m×1.0 m×1.0 m, (Model No. IP70 available from Tecvac Limited) containing the component to be treated 12, and filament 14 made of tungsten, constituting the thermionic emission means.

Connected to the chamber 10 are three gas cylinders 20, 22, 24 containing oxygen, argon and nitrogen respectively, via a flow control device 26.

A typically negative bias voltage is applied to the component 12 by a D.C. bias power supply 28. A similar D.C. high current, low voltage power supply 30 is used to typically negatively bias the filament 14. Also connected to the filament 14 is a heater power supply 32. The chamber 10 also contains radiant heaters 34, 36.

Because the process involves three electrical elements, (the component, the thermionic emission means and the inside of the chamber) the process will be termed triode plasma oxidation (TPO) for convenience.

In use, oxygen and optionally argon, are fed into the chamber 10 and the pressure inside the chamber is maintained at its set point by concurrent use of a diffusion pump 38. A glow discharge occurs due to the potential difference between the inside of the chamber 10 and the component 12 and the pressure of the gas. Sufficient current is passed through the filament 14 to cause thermionic emission, which enhances the energy of the ions in the glow discharge.

Positively charged ions of oxygen and argon will be attracted to the typically negatively charged component, thereby colliding with its surface. The temperature of the chamber is elevated to such a level that the atoms of metal in the component vibrate sufficiently to allow diffusion of the colliding oxygen within the metal component.

The oxidizing stage may be followed by a plasma heating stage where only inert gas is introduced.

Example 1

TPO with Constant Oxygen Flow: Effect of Processing Temperature

Triode plasma oxidation (TPO) was carried out to harden Ti-6Al-4V test discs (from Titanium International, UK) at three different temperatures (600, 650 and 700° C.) for 240 minutes. Oxygen flow was kept constantly on during the process. Ti-6Al-4V test discs having a thickness of 3 mm and a diameter of 30 mm in the annealed condition (384±20 $HK_{0.1}$) and polished to a surface finish of $R_a$=0.040±0.007 μm were ultrasonically cleaned in an alkaline solution and placed into a processing chamber (IP70 chamber available from Tecvac Limited).

After an ultimate chamber pressure lower than $5 \times 10^{-3}$ Pa was obtained, argon was admitted to the chamber to a pressure of 2.0 Pa to carry out a sputter clean step. The workpiece components (test discs) were biased at −1000 V and sputter cleaning was performed for 5 minutes.

A plasma heating step was performed in argon at 0.5 Pa and the workpiece components were biased at −200 V. The tungsten filament was biased at −200 V and the filament heater current was adjusted to yield a current density of 1.5 mA/cm². Plasma heating was carried out until treatment temperature (600 or 650 or 700° C.) was achieved. At this current density value, no auxiliary heating (i.e., radiant heating) was required.

After plasma heating, the oxidation process was begun with the argon pressure being readjusted to 0.28 Pa and oxygen admitted to a pressure of 0.12 Pa to yield a total pressure of 0.4 Pa and gas composition of 70% Ar+30% $O_2$. Both workpiece and filament biases were kept at −200 V (values already pre-set during plasma heating) and the filament heater current was periodically adjusted to keep a constant workpiece current density of 1.5 mA/cm² throughout the treatment.

Following the oxidation process, treated test discs were cooled by introducing nitrogen into the chamber up to a pressure of $10^2$ Pa. When the test disc temperature fell below 200° C., further nitrogen is added into the chamber until atmospheric pressure (~$10^5$ Pa).

Figure 2:
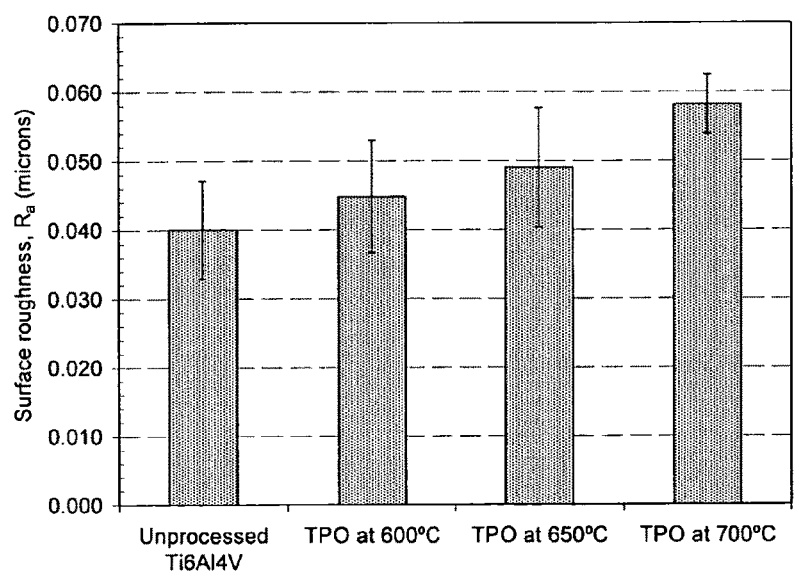
FIG. 2 is a chart showing the surface roughness ($R_a$) obtained after TPO in Ti-6Al-4V at 600, 650 and 700° C.

TPO promotes small changes in surface roughness in comparison to the unprocessed, polished Ti-6Al-4V sample (FIG. 2). Regardless of TPO treatment temperature, the surface roughness after processing is still very low ($R_a$<0.06 μm). As TPO temperature increases, the $R_a$ value increases slightly and is about 0.058 μm at 700° C. The difference in $R_a$ as TPO temperature increases is only marginal and it is worth noting that the values shown in FIG. 2 are statistically similar.

Figure 3:
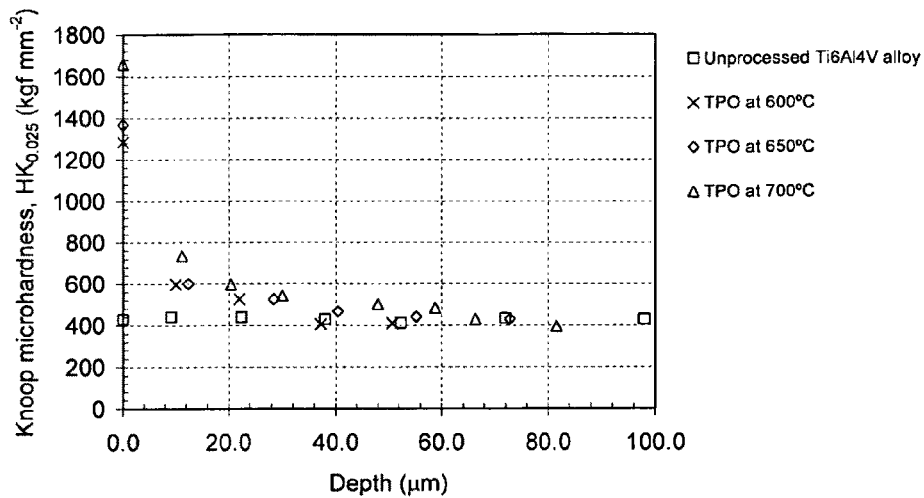
FIG. 3 is a chart showing Knoop microhardness as a function of indentation load, measured at the surface of TPO-treated Ti-6Al-4V samples produced at 600, 650 and 700° C.

After TPO treatment at several temperatures (600, 650 and 700° C.), significant improvements in surface hardness are seen in comparison to unprocessed Ti-6Al-4V (FIG. 3). As TPO temperature increases, the measured surface hardness at a given indentation load also increases. This is probably related to changes in oxide layer thickness. At the lowest indentation loads, high hardness values are recorded, suggesting that a hard surface oxide layer is present. Substantial improvements in surface hardness are still achieved at high indentation loads (e.g., 500 gf and 1000 gf) for the TPO-treated Ti-6Al4V sample at 700° C.

Figure 4:
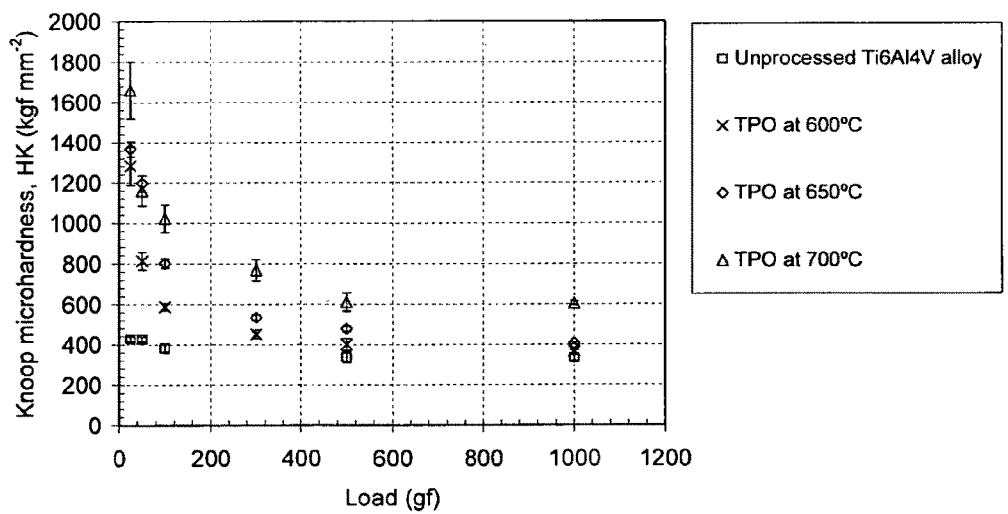
FIG. 4 is a chart showing Knoop microhardness profiles as a function of depth obtained for unprocessed and TPO-treated Ti-6Al-4V samples produced at 600, 650 and 700° C.

The effect of TPO treatment on hardness-depth profile is shown in FIG. 4. After a processing time as short as 240 minutes (4 hours), a hardened layer of approximately 50 μm results at 700° C. As the TPO treatment temperature decreases, the thickness of the hardened layer also decreases. For instance, the treatment depth at 600° C. is about 30 μm.

Figure 5:
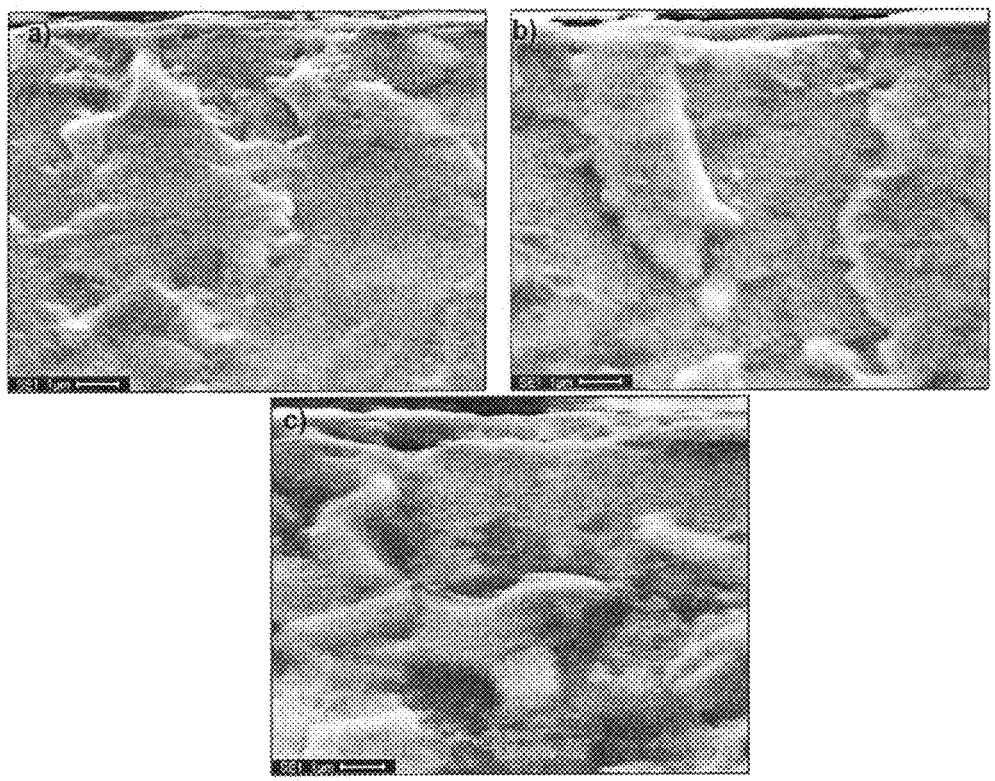
FIG. 5 shows SEM photomicrographs of surface oxide layers formed after TPO treatment at (a) 600° C., (b) 650° C. and (c) TPO at 700° C.
Figure 6:
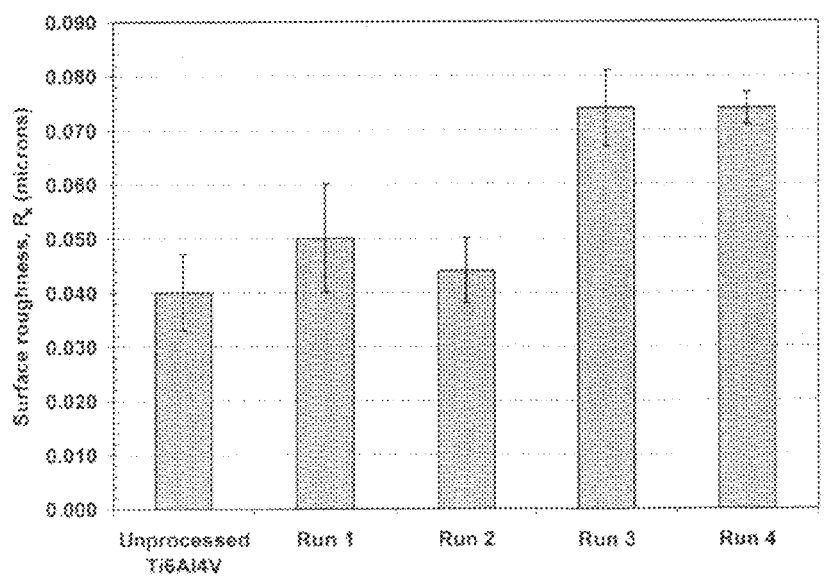
FIG. 6 is a chart showing the surface roughness ($R_a$) of Ti-6Al-4V in unprocessed condition and after TPO treatments.

SEM photomicrographs taken at 10 kX show that a dense oxide layer is always formed at the TPO-treated surface, regardless of TPO temperature (FIG. 5). As the TPO treatment temperature decreases, the thickness of the oxide layer also decreases. Oxide layer thicknesses are 0.7-0.8 μm, 0.2-0.3 μm and 0.1-0.2 μm respectively for TPO carried out at 700° C., 650° C. and 600° C.

Glancing angle XRD data also indicate that the oxide layer structure changes with TPO temperature. At 600° C., the oxide layer consists of a mixture of $TiO_2$-anastase and $TiO_2$-rutile. The data shows that a mixture of $TiO_2$-anastase and $TiO_2$-rutile is still present at 650° C., although $TiO_2$-rutile is more abundant than at 600° C. At 700° C., $TiO_2$-anastase peaks are absent, indicating that the oxide layer at the surface is mainly $TiO_2$-rutile.

Similarly to TPO, plasma heating can be carried out at a total pressure range of 0.1 to 1.0 Pa, preferably 0.4 Pa. Workpiece bias voltages during plasma heating may vary from −100 to −1000 V, preferably −200 V to minimize surface roughening. Filament heater current is periodically adjusted to keep a constant current density in the workpiece. Current density should be set in the range of 0.1 to 4.0 $mA/cm^2$, preferably 1.5 $mA/cm^2$. Radiant heaters may be required to achieve treatment temperature if plasma heating is to be performed at very low current densities. Plasma heating temperatures and times may vary from 400-850° C. and 0.1 to 100 hours respectively.

In this example, plasma heating was carried out at 700° C. and 0.4 Pa total pressure using either (i) argon or (ii) argon+nitrogen discharges. In argon and nitrogen discharges, the gas composition was set at 30% Ar+70% $N_2$ (i.e, argon partial pressure of 0.12 Pa and nitrogen partial pressure of 0.28 Pa). During plasma heating both workpiece and filament were biased at −200 V (same parameters used during TPO) and the filament heater current was adjusted to provide a current density of 1.5 $mA/cm^2$.

Pulsing during TPO and plasma heating conditions are given in Table 1 for each treatment run.

TABLE 1

Summary of pulsing conditions utilised in pulsed TPO treatments followed by plasma heating. Gas mixtures used during plasma heating are also shown.

| TPO run | Pulsing conditions during TPO | | | | Plasma heating duration (mins) | Total treatment duration (mins) |
|---|---|---|---|---|---|---|
| | TPO duration (mins) | Cycle time (mins) | Duty cycle ratio | Gas composition during plasma heating | | |
| 1 | 165 | 30 | 0.50 | 100% Ar | 75 | 240 |
| 2 | 165 | 30 | 0.50 | 30% Ar + 70% $N_2$ | 75 | 240 |
| 3 | 165 | 20 | 0.25 | 100% Ar | 75 | 240 |
| 4 | 165 | 20 | 0.25 | 30% Ar + 70% $N_2$ | 75 | 240 |

Example 2

TPO with Pulsed Oxygen Flow with Plasma Heating in Inert Gas or Inert Gas and Nitrogen Glow Discharges to Suppress Top Oxide Layer In order to demonstrate the effect of pulsing/plasma heating conditions, four runs were performed at 700° C. for a total time of 240 minutes in annealed Ti-6Al-4V test discs, having a surface hardness of (384±20 $HK_{0.1}$) and surface finish of $R_a$=0.040±0.007 μm. Discharge parameters (workpiece and filament bias voltages, current density) were also set as described in Example 1 (−200 V, −200 V and 1.5 $mA/cm^2$ respectively) for each run. Total pressure was 0.4 Pa during TPO, with argon and oxygen partial pressures of 0.28 and 0.12 Pa respectively. Sputter cleaning and plasma heating were also carried out prior to pulsed TPO as elucidated in Example 1. Instead of keeping the oxygen flow constantly on throughout the treatment, its flow was periodically pulsed whilst the argon flow was kept constant. The duration of this pulsed TPO treatment was 165 minutes. Then a plasma heat step at 700° C. was performed immediately after TPO for 75 minutes.

Example 3

Triode Plasma Oxidation Followed by Coating Deposition

As elucidated in Example 2, pulsed TPO followed by a plasma heat step in an inert gas or inert gas and nitrogen gas discharges can produce TPO layers having an oxygen diffusion zone without any surface oxide layer. This structure may be desirable if articles are to be coated with some types of PVD or CVD films (e.g. nitrides, carbides and carbonitrides), as coating adhesion may be limited when these types of films are deposited on oxidized substrates (i.e., having a thin oxide layer at their surface).

In order to illustrate the benefits of TPO and coating deposition, four pulsed TPO treatments followed by plasma heating at 700° C. for a total time of 240 minutes as described in Example 2 were applied to Ti-6Al-4V samples which were coated with 1.6 μm thick PVD TiN. This was carried out as a two-cycle process, whereby samples where first TPO-treated in one reactor, then exposed to atmosphere and placed in a PVD reactor for subsequent TiN coating. For these treatment combinations, an increase in load-bearing capacity of the TiN-coated and triode plasma oxidized Ti-6Al-4V article is expected to occur. This duplex-treated Ti-6Al-4V sample should withstand higher loads without failing, as elastic and plastic deformation of the titanium alloy substrate is greatly minimized by hard, 30 to 50 μm deep oxygen diffusion layers.

Scratch adhesion tests were performed at an increasing load rate of 10 N/min, table speed of 10 mm/min. and pre-load of 5 N. Scratch test results (FIG. 8) show that high critical loads are obtained when TiN is deposited onto TPO layers without a surface oxide layer (Pulsed TPO runs 1, 2, 3 and 4). However, TiN on Ti-6Al-4V subjected to standard TPO (i.e., constant oxygen flow), which has a top $TiO_2$-rutile surface oxide layer (see Example 1), fails adhesively at the 5 N pre-load. The first failure mode of TiN on unprocessed Ti-6Al-4V is adhesive (note that no $L_{C1}$ value is recorded). It is clear that TiN on TPO without a top oxide layer (Runs 1, 2, 3 and 4) exhibits significantly higher critical loads than its non-duplex counterpart (TiN coating on 'unprocessed' Ti-6Al-4V alloy). This result indicates that (i) better coating/substrate adhesion is achieved when the TiN coating is deposited onto the hardened (TPO-treated) Ti-6Al-4V substrate without a top oxide layer and (ii) TiN on TPO-treated Ti-6Al-4V without a top oxide layer exhibits higher load-bearing capacity than its non-duplex (TiN on unprocessed Ti-6Al-4V) counterpart.

The invention claimed is:

1. A process for treating a non-ferrous metal component, comprising:
   (a) placing the non-ferrous metal component into a process chamber;
   (b) after said placing step, reducing the pressure of the process chamber to an overall vacuum pressure of 0.1 to 1.0 Pa, and
   biasing the non-ferrous metal component to have a voltage potential of from 100 to 2000 V;
   (c) starting a pulsed oxygen flow into the process chamber while maintaining the pressure at 0.1 to 1.0 Pa such that a glow discharge comprising oxygen ions is generated, the process chamber additionally comprising a thermionic-emitting filament;
   (d) subsequent to starting a pulsed oxygen flow step, activating the thermionic-emitting filament, and heating the process chamber to a temperature from 300 to 800° C.; and
   (e) subsequent to the starting a pulsed oxygen flow step, providing an oxygen diffusion step of continuously pulsing oxygen flow,
   wherein each pulse in said continuously pulsing oxygen flow has a duty cycle alternating between flowing oxygen to stopping flow,
   the duration of one duty cycle is from 20 to 60 minutes and the ratio of time of flowing oxygen to time of stopping oxygen flow is from 0.15 to 0.85,
   thereby increasing charged species density of the glow discharge, the oxygen ions flowing towards the non-ferrous metal component and colliding the surface thereof at least some of which diffuse into the non-ferrous metal component.

2. A process according to claim 1, wherein the filament has a diameter greater than 1.0 mm.

3. A process according to claim 1 wherein the metal component is selected from titanium, aluminium, magnesium, zirconium and their alloys.

4. A process according to claim 1 wherein inert gas is introduced into the chamber, such that the partial pressure of oxygen in the chamber is less than 75%.

5. A process according to claim 1, wherein the pressure in the process chamber during the oxygen diffusion step is approximately 0.4 Pa.

6. A process according to claim 1, wherein the potential is from 100 to 500 V.

7. A process according to claim 1, wherein the temperature of the component is from 400 to 700° C.

8. A process according to claim 1, wherein the oxygen diffusion step is carried out for from 0.1 to 100 hours.

9. A process according to claim 8, wherein the oxygen diffusion step is carried out for from 0.3 to 20 hours.

10. A process according to claim 1, wherein the duty cycle ratio is from 0.25 to 0.75.

11. A process according to claim 1, further comprising a coating process.

12. A process according to claim 11, wherein the coating process is a PVD and/or CVD coating process.

* * * * *